(12) United States Patent
Saenger et al.

(10) Patent No.: US 9,955,563 B2
(45) Date of Patent: Apr. 24, 2018

(54) EUV LIGHT SOURCE FOR GENERATING A USABLE OUTPUT BEAM FOR A PROJECTION EXPOSURE APPARATUS

(71) Applicant: Carl Zeiss SMT GmbH, Oberkochen (DE)

(72) Inventors: Ingo Saenger, Heidenheim (DE); Manfred Maul, Aalen (DE); Christoph Hennerkes, Huettlingen (DE); Johannes Ruoff, Aalen (DE); Daniel Kraehmer, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 91 days.

(21) Appl. No.: 14/636,413

(22) Filed: Mar. 3, 2015

(65) Prior Publication Data

US 2015/0173163 A1    Jun. 18, 2015

Related U.S. Application Data

(63) Continuation of application No. PCT/EP2013/072043, filed on Oct. 22, 2013.
(Continued)

(30) Foreign Application Priority Data

Oct. 31, 2012    (DE) .................. 10 2012 219 936

(51) Int. Cl.
*G03B 27/72* (2006.01)
*H05G 2/00* (2006.01)
(Continued)

(52) U.S. Cl.
CPC ........... *H05G 2/001* (2013.01); *G02B 27/286* (2013.01); *G03F 7/70033* (2013.01);
(Continued)

(58) Field of Classification Search
CPC .... G02B 27/286; G21K 1/16; G03F 7/70033; G03F 7/70075; G03F 7/70116;
(Continued)

(56) References Cited

U.S. PATENT DOCUMENTS

| 5,896,438 A | 4/1999 | Miyake et al. |
| 6,498,351 B1 | 12/2002 | Kruizinga et al. |

(Continued)

FOREIGN PATENT DOCUMENTS

| DE | 103 58 225 B3 | 6/2005 |
| DE | 102006039655 A1 | 3/2008 |

(Continued)

OTHER PUBLICATIONS

Chinese Office Action and Search Report, with translation thereof, for CN Appl No. 201380054067.7, dated Jan. 25, 2016.
(Continued)

*Primary Examiner* — Peter B Kim
(74) *Attorney, Agent, or Firm* — Fish & Richardson P.C.

(57) ABSTRACT

An EUV light source serves for generating a usable output beam of EUV illumination light for a projection exposure apparatus for projection lithography. The light source has an EUV generation device which generates an EUV raw output beam. The latter is circularly polarized. For the purposes of setting the polarization of the usable output beam and in respect of the polarization direction, a polarization setting device has a linearly polarizing effect on the raw output beam. This results in an EUV light source, which provides an improved output beam for a resolution-optimized illumination.

20 Claims, 5 Drawing Sheets

Related U.S. Application Data (60) Provisional application No. 61/720,444, filed on Oct. 31, 2012.

(51) Int. Cl.
*G02B 27/28* (2006.01)
*G03F 7/20* (2006.01)
*G21K 1/06* (2006.01)
*G21K 1/16* (2006.01)
*H01J 35/00* (2006.01)
*H05H 7/04* (2006.01)

(52) U.S. Cl.
CPC ...... *G03F 7/70075* (2013.01); *G03F 7/70116* (2013.01); *G03F 7/70308* (2013.01); *G03F 7/70566* (2013.01); *G21K 1/06* (2013.01); *G21K 1/062* (2013.01); *G21K 1/16* (2013.01); *H01J 35/00* (2013.01); *H05H 7/04* (2013.01)

(58) Field of Classification Search
CPC .. G03F 7/70308; G03F 7/70566; H01J 35/00; H05F 2/001; H05H 7/04
USPC ................................... 355/71, 67
See application file for complete search history.

(56) References Cited

U.S. PATENT DOCUMENTS

| | | | |
|---|---|---|---|
| 6,999,172 B2 | 2/2006 | Masaki et al. | |
| 7,129,807 B2 | 10/2006 | Rossmanith et al. | |
| 8,134,440 B2 | 3/2012 | Beckenbach et al. | |
| 8,781,076 B2 | 7/2014 | Kuroda et al. | |
| 2002/0176166 A1 | 11/2002 | Schuster | |
| 2003/0043359 A1 | 3/2003 | Naulleau | |
| 2003/0043455 A1 | 3/2003 | Singer et al. | |
| 2003/0081210 A1 | 5/2003 | Masaki et al. | |
| 2004/0184019 A1 | 9/2004 | Totzeck et al. | |
| 2006/0146384 A1 | 7/2006 | Schultz et al. | |
| 2006/0158288 A1 | 7/2006 | Rossmanith et al. | |
| 2007/0152171 A1 | 7/2007 | Goldstein et al. | |
| 2008/0152090 A1* | 6/2008 | Yamada | G03F 7/70008 378/124 |
| 2008/0192225 A1 | 8/2008 | Mann et al. | |
| 2009/0213356 A1 | 8/2009 | Gruner et al. | |
| 2009/0250637 A1* | 10/2009 | Akins | H05G 2/001 250/492.1 |
| 2010/0045410 A1 | 2/2010 | Beckenbach et al. | |
| 2011/0001947 A1 | 1/2011 | Dinger et al. | |
| 2011/0014799 A1 | 1/2011 | Dinger et al. | |
| 2011/0177463 A1 | 7/2011 | Layh et al. | |
| 2012/0281816 A1 | 11/2012 | Kuroda et al. | |
| 2014/0362360 A1 | 12/2014 | Saenger | |
| 2015/0055110 A1 | 2/2015 | Maul | |
| 2015/0124233 A1 | 5/2015 | Patra | |

FOREIGN PATENT DOCUMENTS

| | | |
|---|---|---|
| EP | 0 627 667 A1 | 12/1994 |
| EP | 1 225 481 A | 7/2002 |
| EP | 1 260 849 A1 | 11/2002 |
| JP | H07-288200 A | 10/1995 |
| JP | 2000-269130 | 9/2000 |
| JP | 2003-133212 | 5/2003 |
| JP | 2007-501528 | 1/2007 |
| JP | 2007-514285 A | 5/2007 |
| JP | 2008-538452 | 10/2008 |
| JP | 2010-502003 | 1/2010 |
| JP | 2010-511273 A | 4/2010 |
| JP | 2015-511770 | 4/2015 |
| JP | 2015-523720 | 8/2015 |
| JP | 2015-525906 | 9/2015 |
| WO | WO 2006/111319 | 10/2006 |
| WO | WO 2009/121438 A1 | 10/2009 |
| WO | WO 2011/083727 | 7/2011 |
| WO | WO 2011/083727 A1 | 7/2011 |

OTHER PUBLICATIONS

Korean office action, with English translation thereof, for KR Appl No. 10-2015-7008809, dated Apr. 14, 2016.
International Search Report for corresponding PCT Appl No. PCT/EP2013/072043, dated Apr. 9, 2014.
Koide T et al. "Polarization characterization of circularly polarized vacuum-ultraviolet and soft-X-ray helical undulator radiation", Review of Scientific Instruments, AIP, Melville, NY, vol. 66, No. 2, Part II, Feb. 1, 1995, pp. 1923-1925.
Uwe Schindler "Ein supraleitender Undulator mit elektrisch umschaltbarer Helizität" [A superconducting undulator with electrically switchable helicity], Forschungszentrum Karlsruhe in Helmholtz-Gemeinschaft, scientific reports, FZKA 6997, Aug. 2004, with English abstract at p. iii.
Japanese office action with English translation with respect to JP Appl No. 2015-538047, dated Mar. 15, 2016.
German Office Action, with translation thereof, for corresponding DE Appl No. 10 2012 219 936.5, dated Jul. 16, 2013.
Japanese Office Action with English translation thereof for corresponding JP Appl. No. 2015-538407, dated Oct. 31, 2016, 10 pages.
Chinese Office Action with English translation thereof for corresponding CN Appl. No. 201480014883.X, dated Oct. 9, 2016, 16 pages.
Korean office action, with English translation thereof, for corresponding Korean Appl No. 10-2015-7008809, dated Feb. 22, 2107.
Chinese office action with English translation with respect to CN App. U.S. Ser. No. 2013 8005 4067.7, dated Nov. 8, 2016, 25 pages.
Taiwanese office action, with English translation thereof, for corresponding Appl No. 102139421, dated May 9, 2017.
Chinese Office Action and Search Report, with translation thereof, for corresponding Appl No. 201380054067.7, dated Jul. 4, 2017.
Taiwanese office action and search report, with English translation thereof, with respect to Appl No. 102 139 421, dated Oct. 27, 2017.

\* cited by examiner

EUV LIGHT SOURCE FOR GENERATING A USABLE OUTPUT BEAM FOR A PROJECTION EXPOSURE APPARATUS

CROSS-REFERENCE TO RELATED APPLICATIONS

The present application is a continuation of, and claims benefit under 35 USC 120 to, international application PCT/EP2013/072043, filed Oct. 22, 2013, which claims benefit under 35 USC 119 of German Application No. 10 2012 219 936.5, filed Oct. 31, 2012. International application PCT/EP2013/072043 also claims priority under 35 USC 119(e) to U.S. Provisional Application No. 61/720,444, filed Oct. 31, 2012. The contents of international application PCT/EP2013/072043 and German Patent Application DE 10 2012 219 936.5 are incorporated by reference herein.

The invention relates to an EUV light source for generating a usable output beam of EUV illumination light for a projection exposure apparatus for projection lithography. Furthermore, the invention relates to an illumination system with such a light source, an optical system with such an illumination system, a projection exposure apparatus with such an optical system, a production method for a microstructured or nanostructured component which uses such a projection exposure apparatus and a microstructured or nanostructured component produced via this method.

A projection exposure apparatus with an illumination system is known from WO 2009/121 438 A1. An EUV light source is known from DE 103 58 225 B3. Further references from which an EUV light source is known can be found in WO 2009/121 438 A1. EUV illumination optical units are furthermore known from US 2003/0043359 A1 and U.S. Pat. No. 5,896,438. Variants for generating polarized EUV light and for the geometric polarization rotation are known from U.S. Pat. No. 6,999,172 B2 and US 2008/0192225 A1.

It is an object of the present invention to develop an EUV light source in such a way that an improved output beam is provided for a resolution-optimized illumination.

According to the invention, this object is achieved by an EUV light source for generating a usable output beam of EUV illumination light for a projection exposure apparatus for projection lithography. The EUV light source includes an EUV generation device which generates an EUV raw output beam, wherein the EUV raw output beam is circularly polarized. The EUV light source also includes a polarization setting device which, in respect of the polarization direction, has a linearly polarizing effect on the raw output beam for setting the polarization of the usable output beam.

According to the invention, it was identified that linearly polarized EUV illumination light can be used particularly well for a resolution-optimized illumination. The polarization setting device according to the invention provides such linearly polarized EUV illumination light in the form of a usable output beam. Due to a circularly polarized EUV raw output beam being generated initially, the result of this is the option of generating linearly polarized light with, initially, an arbitrarily pre-definable polarization orientation. The result of this is a polarization specification with a transmission loss due to the polarization setting that is as low as possible. The EUV generation device of the light source can be embodied as an undulator. Deflection magnets of the undulator can be designed in a displaceable fashion. The displacement of the deflection magnets can be used to generate a linearly polarized usable output beam in the undulator. Via an exit pupil in an illumination device, the EUV light source can be used to realize an illumination of an illumination field via the usable output beam which, at least locally, is linearly polarized. In particular, as a result of the use of downstream components of an illumination optical unit, it is possible to achieve a tangentially polarized illumination (TE polarization) of an illumination field via the usable output beam. In the case of the tangentially polarized illumination, a linear polarization direction of the usable output beam is, independently of the illumination angle, always polarized perpendicular to a plane of incidence on the illumination field. Moreover, the EUV light source can be used to set linearly polarized dipole illuminations, in which an additional transmission loss due to a polarization setting is dispensed with. In the case of dipole illumination with such linear polarization, an illumination field is illuminated from two main directions, from which the illumination field is in each case impinged upon by linearly polarized illumination light.

The EUV light source can have an electron beam-based design; for example, it can be designed as an x-ray beam source on the basis of a free electron laser (FEL). Alternatively, the EUV light source can also be embodied as a plasma source, wherein the EUV radiation emanates either with the aid of a driver laser (LPP source) or with the aid of a gas discharge (GDPP source). In the case of an electron beam-based EUV light source that an includes an electron beam supply device that provides an electron beam to the EUV generation device, a circularly polarized EUV raw output beam can be generated efficiently.

The EUV light source can generate radiation with a wavelength of between 3 nm and 15 nm.

The polarization setting device can have at least one EUV deflection mirror operated in the region of a Brewster angle of incidence for the raw output beam, which EUV deflection mirror can be rotated about an axis coinciding with an axis of incidence of the raw output beam for the purposes of rotating a plane of incidence. Such a setting device enables a specification of a specific linear polarization direction which is, in particular, controlled. The usable output beam can be provided with the same power, independently of the polarization direction.

The polarization setting device can have at least two EUV deflection mirrors, wherein the usable output beam propagates in the same direction as the raw output beam after deflection at the last EUV deflection mirror of the polarization setting device. Such a setting device reduces the requirements demanded of an illumination optical unit, following the EUV light source, for illuminating an illumination field of the projection exposure apparatus. If both EUV deflection mirrors are operated in the region of a Brewster angle of incidence of the EUV light, this results in linearly polarized EUV illumination light with a particularly good polarization contrast ratio.

The polarization setting device can have exactly two EUV deflection mirrors, wherein the usable output beam propagates parallel to the raw output beam after deflection at the second EUV deflection mirror. The polarization setting device can have at least three EUV deflection mirrors, wherein the usable output beam propagates along the axis of incidence of the raw output beam after deflection at the third EUV deflection mirror. Such embodiments reproduce variants of a design of the setting device. The latter embodiment enables a polarization setting in which various polarization angles of a linear polarization of the usable output beam can be specified without beam off-set. All three EUV deflection mirrors can be operated in the region of a Brewster angle of incidence of the EUV illumination light; however, this is not mandatory.

An EUV deflection prism can have an EUV deflection prism, of which two side surfaces are employed as mirror surfaces. Such an EUV deflection prism can be realized in a compact manner.

The polarization setting device can have exactly three EUV deflection mirrors, wherein all three EUV deflection mirrors are in the region of a Brewster angle of incidence for the raw output beam. Such an embodiment leads to the option of a once again improved polarization contrast ratio.

The advantages of an illumination system including such an EUV such light source, an optical system such an illumination system, a projection exposure apparatus including such an optical, a production method using such an apparatus and a microstructured or nanostructured component produced by such a method correspond to those which were already explained above with reference to the EUV light source according to the invention. An image-side numerical aperture of the projection optical unit of the optical system can be greater than 0.4 and can be greater than 0.5.

The polarization setting device can be a component of the EUV light source; however, in some embodiments, it can also be a component of the illumination optical unit. The general principle of setting the polarization for generating at least locally linear polarization from circularly polarized input light can be realized both in the case of light source-side generation of a usable output beam or else during the further course of a raw output beam through the illumination optical unit.

Exemplary embodiments of the invention will be explained in more detail below on the basis of the drawing. In this.

Figure 1:
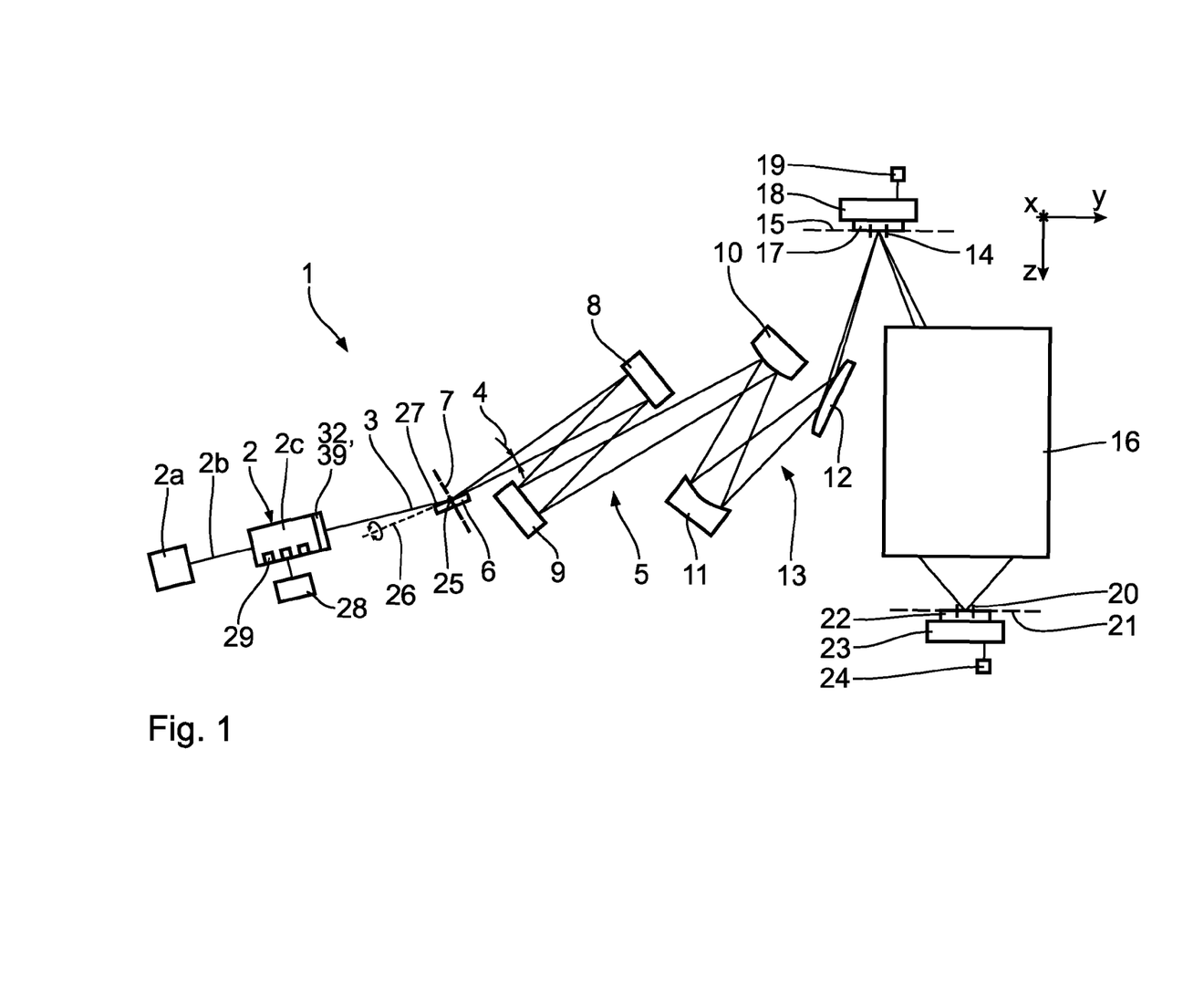
FIG. 1 shows, schematically and with reference to an illumination optical unit, a projection exposure apparatus for EUV projection lithography in a meridional section.

A microlithographic projection exposure apparatus 1 serves for producing a microstructured or nanostructured electronic semiconductor component. A light source or radiation source 2 emits EUV radiation in the wavelength range of between e.g. 3 nm and 30 nm, in particular of between 3 nm and 15 nm. The light source 2 is embodied as free electron laser (FEL). This is a synchrotron radiation source, which generates coherent radiation with very high brilliance. Prior publications in which such FELs are described are specified in WO 2009/121 438 A1. A light source 2 which may for example be utilized is described in Uwe Schindler "Ein supraleitender Undulator mit elektrisch umschaltbarer Helizität" [A superconducting undulator with electrically switchable helicity], Forschungszentrum Karlsruhe in Helmholtz-Gemeinschaft, scientific reports, FZKA 6997, August 2004, and in DE 103 58 225 B3.

The EUV light source 2 has an electron beam supply device 2a for generating an electron beam 2b and an EUV generation device 2c. The electron beam 2b is supplied to the latter by the electron beam supply device 2a. The EUV generation device 2c is embodied as an undulator. The undulator may optionally have undulator magnets which can be adjusted by displacement.

The light source 2 has a mean power of 2.5 kW. The pulse frequency of the light source 2 is 30 MHz. Then, each individual radiation pulse carries energy of 83 µJ. In the case of a radiation pulse length of 100 fs, this corresponds to a radiation pulse power of 833 MW.

For illumination and imaging within the projection exposure apparatus 1, a usable radiation bundle 3, which is also referred to as usable output beam, is used as illumination light. The usable radiation bundle 3 is radiated out within an aperture angle 4, which is matched to an illumination optical unit 5 of the projection exposure apparatus 1, with the aid of a scanning device 6. Proceeding from the light source 2, the usable radiation bundle 3 has a divergence of less than 5 mrad. The scanning device 6 is arranged in an intermediate focus plane 7 of the illumination optical unit 5. After the scanning device 6, the usable radiation bundle 3 is initially incident on a field facet mirror 8.

In particular, the usable radiation bundle 3 has a divergence which is less than 2 mrad and preferably less than 1 mrad. The spot size of the usable radiation bundle on the field facet mirror 8 is approximately 4 mm.

After being reflected at the field facet mirror 8, the usable radiation bundle 3, which is subdivided into pencils of rays associated with individual field facets (not depicted) of the field facet mirror 8, is incident on a pupil facet mirror 9. Pupil facets, which are not depicted in FIG. 1, of the pupil facet mirror 9 are round. Each pencil of rays of the usable radiation bundle 3, reflected by one of the field facets, is associated with one of these pupil facets such that an impinged upon facet pair with one of the field facets and one of the pupil facets in each case defines an illumination channel or beam guidance channel for the associated pencil of rays of the usable radiation bundle 3. The channel-by-channel assignment of the pupil facets to the field facets is brought about dependent on a desired illumination by the projection exposure apparatus 1. Thus, for setting individual illumination angles, the output beam 3 is routed along the illumination channel in a sequence of a pairs of respectively one of the field facets and respectively one of the pupil facets. In order to actuate respectively predetermined pupil facets, the field facet mirrors are in each case tilted individually.

The field facets are imaged in an illumination or object field 14 in a reticle or object plane 15 of a projection optical unit 16 of the projection exposure apparatus 1 via the pupil facet mirror 9 and a subsequent transmission optical unit 13 consisting of three EUV mirrors 10, 11, 12. The EUV mirror 12 is embodied as a grazing incidence mirror.

The sequence of the individual illumination angles, which is set by an individual facet pair, results in an illumination angular distribution of the illumination of the object field 14, which is brought about by the illumination optical unit 5, via the scanning integration of all illumination channels, which is brought about by an illumination of the field facets of the field facet mirror 8 with the aid of the scanning device 6.

In the case of an embodiment of the illumination optical unit 5 (not depicted), in particular in the case of a suitable position of an entry pupil of the projection optical unit 16, it is also possible to dispense with the mirrors 10, 11 and 12, leading to a corresponding increase in the transmission of the projection exposure apparatus 1 for the usable radiation bundle 3.

A reticle 17 reflecting the usable radiation bundle 3 is arranged in the object plane 15 in the region of the object field 14. The reticle 17 is supported by a reticle holder 18, which can be displaced when actuated by a reticle displacement drive 19.

The projection optical unit 16 images the object field 14 in an image field 20 in an image plane 21. During the projection exposure, a wafer 22 is arranged in this image plane 21, which wafer carries a light-sensitive layer which is exposed during the projection exposure with the projection exposure apparatus 1. The wafer 22 is supported by a wafer holder 23, which in turn can be displaced in a controlled manner via a wafer displacement drive 24.

In order to simplify the depiction of position relationships, an xyz coordinate system is used below. The x-axis is perpendicular to the plane of the drawing of FIG. 1 and points into the latter. In FIG. 1, the y-axis extends to the right. In FIG. 1, the z-axis extends downward. In the overall depictions of the projection exposure apparatus 1, the z-direction extends perpendicular to the image plane 21. In the depictions which relate to the light source 2 or the illumination-optical components, the z-direction extends along a main propagation direction of the EUV light.

In the projection exposure apparatus 1 according to FIG. 1, the field facet mirror 8 is the first facet mirror and the pupil facet mirror 9 is the second facet mirror in the beam path of the illumination light 3. The facet mirrors 8, 9 can also interchange their functions. Thus, the first facet mirror 8 can be a pupil facet mirror, which is then arranged in a pupil plane of the projection optical unit 16 or in a plane conjugate thereto, and the second facet mirror 9 can be a field facet mirror, which is then arranged in a field plane that is optically conjugate to the object plane 15.

During the projection exposure, both the reticle and the wafer are scanned in a synchronized manner in the y-direction in FIG. 1 by corresponding actuation of the reticle displacement drive 19 and the wafer displacement drive 24. During the projection exposure, the wafer is scanned in the y-direction with a scanning speed of typically 600 mm/s. The synchronized scanning of the two displacement drives 19, 24 can occur independently of the scanning operation of the scanning device 6.

The long side of the field facets is perpendicular to the scanning direction y. The x/y aspect ratio of the field facets corresponds to that of the slit-shaped object field 14, which can likewise have a rectangular or curved design.

The scanning device 6 is a scanning mirror, which reflects the usable radiation bundle 3 in a grazing fashion and which can be tilted about a line scanning axis 25 extending parallel to the x-axis in FIG. 1 and about a line feed axis 26, which is perpendicular thereto and lies in the yz-plane in FIG. 1. Both axes 25, 26 lie in a reflecting mirror surface 27 of the scanning device 6.

The EUV light source 2 has a raw polarization setting device 28, which, for setting the polarization of a raw output beam 30 (cf. FIG. 2), exerts a deflecting effect on the electron beam 2b in the EUV generation device 2c. The raw polarization setting device 28 is realized by a corresponding arrangement of deflection magnets 29 of the undulator 2c. These deflection magnets 29 are arranged such that the EUV raw output beam 30 has circular polarization (cf. FIG. 2), indicated in FIG. 2 by an appropriate polarization symbol 31 (circular arrow). A corresponding arrangement of the deflection magnets 29 for realizing a circularly polarized EUV output beam is described in the Schindler reference, already cited above. The optional adjustability of the undulator magnets of the undulator can be used in a targeted manner for switching from linearly to circularly polarized EUV light. Here, the raw polarization setting device 28 simultaneously serves as switching unit for switching between a circular polarization of the EUV raw output beam 30 and a linear polarization of the EUV raw output beam 30.

Some of the deflection magnets 29 as components of the undulator 2c are indicated schematically in FIG. 1.

The EUV light source 2 furthermore has a polarization setting device 32, which, for setting the polarization of the usable output beam 3, exerts a linearly polarizing effect in respect of the polarization direction on the raw output beam 30.

Figure 2:
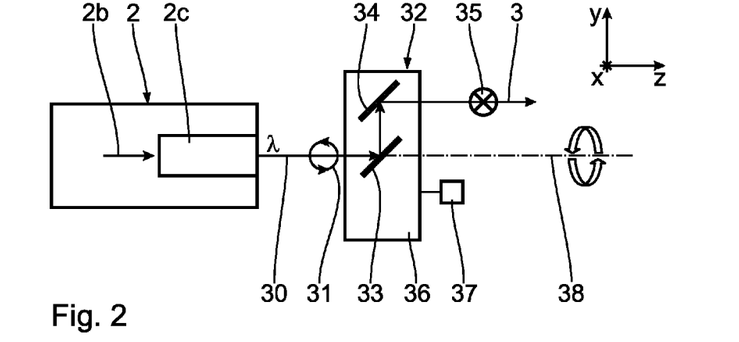
FIGS. 2 and 3 show two variants of a polarization setting device of an EUV light source of the projection exposure apparatus.

FIG. 2 shows a variant of the polarization setting device 32. It has a first EUV deflection mirror 33, which is operated in the region of a Brewster angle of incidence, and has, arranged downstream thereof, a further EUV deflection mirror 34, which is likewise operated in the region of a Brewster angle of incidence for the raw output beam 30. The planes of incidence of the deflection mirrors 33 and 34 coincide.

The usable output beam 3 reflected by the second deflection mirror 34 is linearly polarized perpendicular to the planes of incidence of the deflection mirrors 33, 34, i.e. parallel to the x-axis in FIG. 2, which is indicated by an appropriate polarization symbol 35 (cross within a circle).

The two deflection mirrors 33, 34 are supported in a manner not depicted in any more detail by a common support body 36 of the polarization setting device 32 and are arranged fixed relative to one another. With the aid of a rotational drive 37, the support body 36 can be rotated about a rotational axis 38 which coincides with an axis of incidence of the raw output beam 30 on the first deflection mirror 33 of the polarization setting device 32. A rotation of the support body 36 brings about a corresponding rotation of the planes of incidence of the raw output beam 30 on the deflection mirrors 33, 34 and a corresponding rotation of a linear polarization direction of the usable output beam 3.

After the deflection at the second deflection mirror 34, the usable output beam 3 propagates in the same direction as the raw output beam 30.

The polarization setting device 32 according to FIG. 2 has exactly two deflection mirrors 33, 34. After the deflection at the second deflection mirror 34, the usable output beam 3 propagates parallel to the raw output beam 30.

As a result of the double Brewster reflection at the deflection mirrors 33 and 34, a linear polarization of the usable output beam 3 is achieved with a high contrast ratio between an intensity of the usable output beam 3 with a polarization component parallel to the set linear polarization in relation to the intensity of the polarization component perpendicular thereto.

Figure 3:
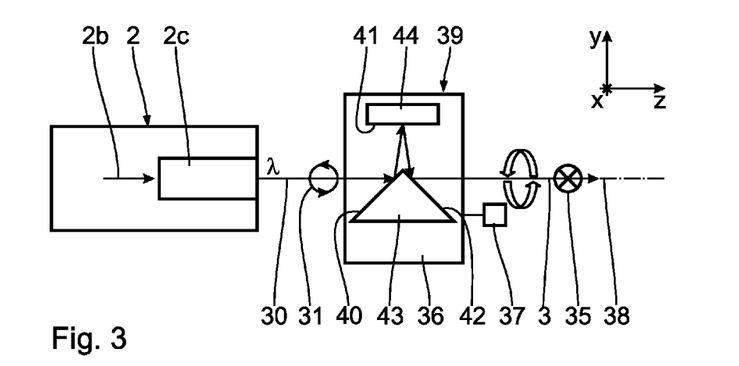

FIG. 3 shows a variant of a polarization setting device 39, which can be used in place of the polarization setting device 32. Components corresponding to those which were already explained above with reference to FIG. 2 are denoted by the same reference signs and are not discussed again in detail.

The polarization setting device 39 has three EUV deflection mirrors with mirror surfaces 40, 41, 42. The first mirror surface 40 and the third mirror surface 42 are components of an EUV deflection prism 43 which combines two of the three mirrors; in this EUV deflection prism, two leg-side surfaces are employed as mirror surfaces 40, 42. The reflections at the mirror surfaces 40 to 42 all occur within the same plane of incidence which, in the illustrated rotational position of the polarization setting device 39, coincides with the yz-plane.

The reflections at the mirror surfaces 40 and 42, i.e. at the deflection prism 43, occur in the region of a Brewster angle of incidence. The reflection at the mirror surface 41 of an EUV deflection mirror 44 occurs near perpendicular incidence. Alternatively, it is possible to design all three reflections at the mirror surfaces 40 to 42 as having an angle of incidence in the region of 60°. The Brewster angle of incidence lies in the region of between 40° and 47°, in particular in the region of 45°. Depending on a multilayer reflection layer design at the mirror surfaces 40 to 42, the Brewster angle of incidence can deviate from 45° and can, for example, be 43°.

In this case, an angle between the two mirror surfaces 40, 42 would not—like in the embodiment according to FIG. 3—be in the region of 90°, but rather in the region of 120°.

The deflection prism 43 and the deflection mirror 44 are once again supported together by the support body 36.

After the reflection at the third deflection mirror 42, the usable output beam 3 propagates along the axis of incidence of the raw output beam 30 to the first deflection mirror 40 of the polarization setting device 39. A rotation of the polarization setting device 39 about the rotational axis 38 for specifying the linear polarization direction of the usable output beam 3 therefore does not lead to a beam offset of the usable output beam 3.

Instead of the deflection prism 43, it is also possible to use two individual mirrors arranged separately from one another, the mirror surfaces of which are oriented in accordance with the mirror surfaces 40 and 42.

It is also possible to use further variants of the polarization setting device with more than three mirror surfaces.

The variants of the polarization setting device described above can also be a component of the illumination optical unit 5 of the projection exposure apparatus 1. This is depicted schematically in FIG. 4. Components and functions corresponding to those which were already explained above with reference to FIGS. 1 to 3 are denoted by the same reference signs and are not discussed again in detail. In this embodiment, the EUV light source 2 generates a circularly polarized EUV raw output beam 30. The latter is then linearly polarized by a polarization setting device 44 such that this results in the linearly polarized usable output beam 3. The beam can then, as already explained above, bring about a tangentially polarized illumination of the object field 14.

Figure 4:
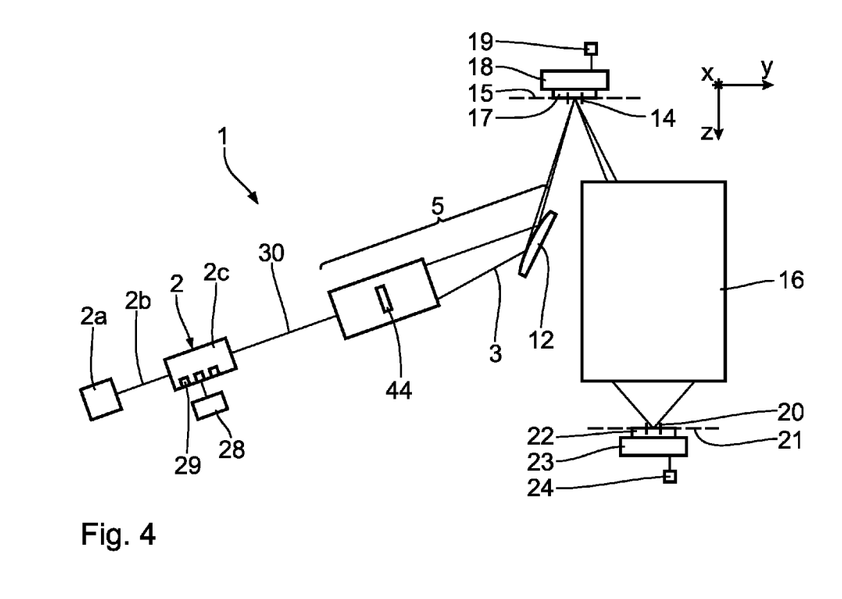
FIG. 4 shows a further embodiment of a projection exposure apparatus for EUV projection lithography in an illustration similar to FIG. 1.

In the schematic illustration of FIG. 4, the polarization setting device 44 is arranged in front of an EUV mirror 12 operated in a grazing fashion. Alternatively, the polarization setting device 44 can also be arranged directly in front of the object field 14. The EUV mirror 12 operated in a grazing fashion can also be dispensed with in one variant of the illumination optical unit 5.

Two variants of the polarization setting device 44 are explained in more detail below on the basis of FIGS. 5 and 6. Components which correspond to those which were already discussed above with reference to FIGS. 1 to 4 are once again denoted by the same reference signs and will not be discussed again in detail.

Figure 5:
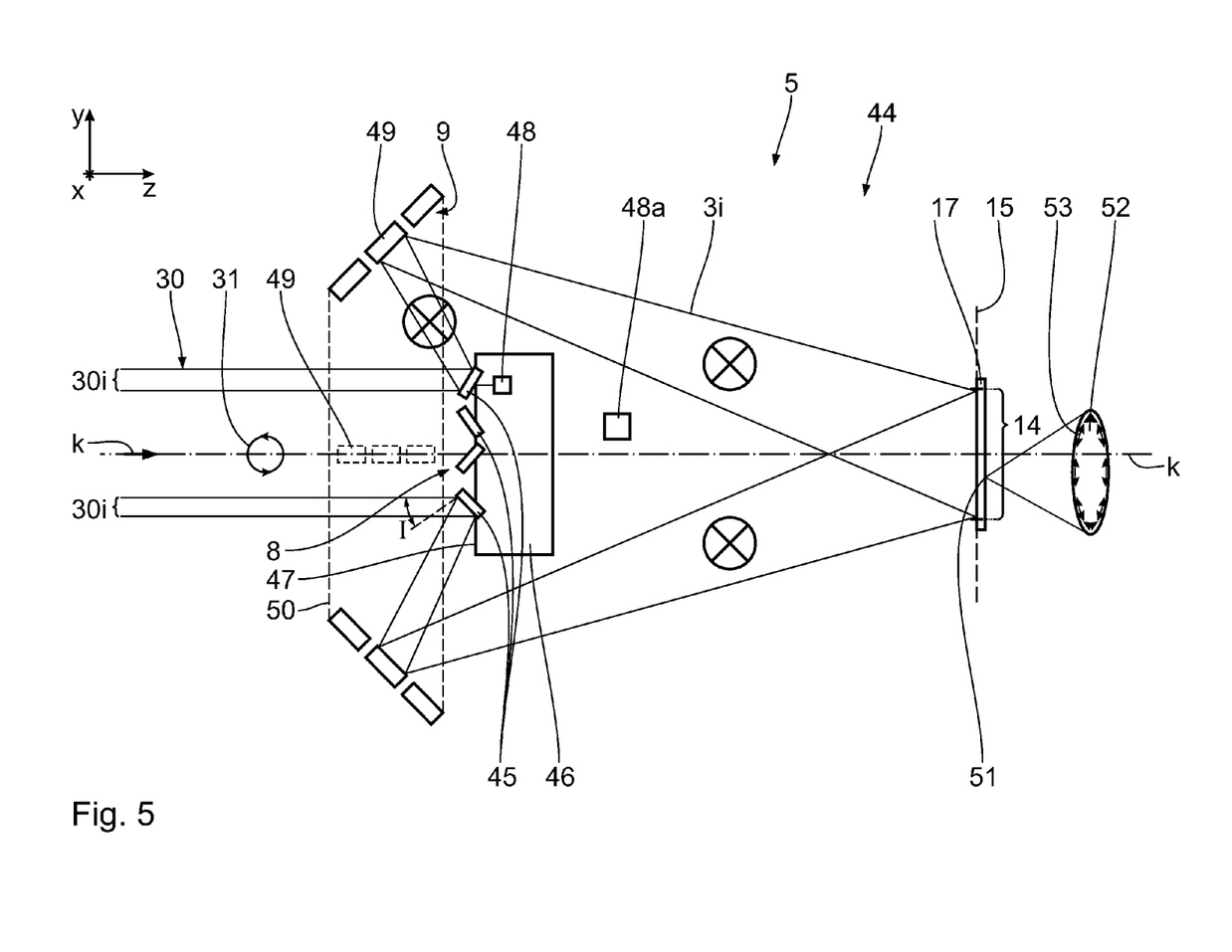
FIG. 5 shows a meridional section of a polarization setting device, which can be used in the projection exposure apparatus according to FIG. 4.

In the case of the illumination optical unit 5 in the embodiment according to FIG. 5, the first facet mirror 8 has a plurality of individual mirrors 45, which provide illumination channels for guiding partial bundles of illumination light $30_i$ to the object field or to the illumination field 14. In the illumination optical unit 5 according to FIG. 5, the EUV mirrors after the second facet mirror 9 are dispensed with. The individual mirrors 45 are arranged on an individual mirror support 46. The individual mirror support 46 has a rotationally symmetric design in relation to an axis of incidence k of the circularly polarized raw illumination light 30, which axis of incidence extends parallel to the z-axis.

The individual mirror support 46 is designed with a round support face 47 arranged parallel to the xy-plane. Spatially, the individual mirror support 46 is situated between the incident raw illumination light 30 and the object field 14.

The individual mirrors 45 can have square or rectangular reflection surfaces, which are arranged tightly packed on the individual mirror support 46. It is also possible to employ other forms of individual mirrors which enable a cover of the reflection surface of the first facet mirror 8 with as few gaps as possible. Such alternative individual mirror shapes are known from the mathematical theory of tessellation. In this context, reference is made to the references specified in US 2011/0001947 A1.

Depending on the embodiment of the first facet mirror 8, the individual mirrors 45 have x/y extents in the region of e.g. 100 µm×100 µm to, for example, 5 mm×5 mm. The individual mirrors 45 can be shaped such that they have a focusing effect on the raw illumination light 30.

The individual mirrors 45 can have an arrangement on the individual mirror support 46 which is rotationally symmetric in relation to the axis of incidence k of the raw illumination light 30. By way of example, this arrangement can be embodied in a plurality of concentric rings of individual mirrors 45 on the individual mirror support 46, wherein the center of this individual mirror arrangement coincides with an intersection point of the axis of incidence k of the raw illumination light 30 with the support face 47.

Four of the individual mirrors 45 are illustrated in an exemplary fashion in the meridional section according to FIG. 5. In a real embodiment of a first facet mirror 8, the number of individual mirrors 45 is much higher. Overall, the first facet mirror 8 has several hundred to several thousand individual mirrors 45.

An overall reflection surface of the first facet mirror 8, which is composed of the reflection surfaces of the individual mirrors 45, has, depending on the embodiment of the first facet mirror 8, an extent of e.g. 300 mm×300 mm or 600 mm×600 mm.

Each one of the individual mirrors 45 is respectively connected to an actuator 48 for individual deflection of incident illumination light 30, as indicated in FIG. 5 on the basis of the uppermost illustrated individual mirror 45. The actuators 48 are arranged on the side of each of the individual mirrors 45 distant from a reflecting side of the individual mirrors 45. By way of example, the actuators 48 can be embodied as piezo-actuators. Embodiments of such actuators are known from the design of micro-mirror arrays.

The actuators 48 are signal connected in a manner not depicted to a central control device 48a, via which the actuators 48 can be actuated for individual tilting of the individual mirrors 45.

Each one of the individual mirrors 45 can be tilted individually and independently about two mutually perpendicular tilt axes, with a first of these tilt axes extending parallel to the x-axis and the second one of these two tilt axes extending parallel to the y-axis. The two tilt axes lie in the individual reflection surfaces of the respective individual mirrors 45.

The reflection surfaces of the individual mirrors 45 carry multilayer reflection coatings.

The individual mirrors 45 of the first facet mirror 8 are arranged such that the respective partial bundle of raw illumination light $30_i$ is incident on the individual mirror 45 with an angle of incidence I to a normal N on the individual mirror reflection surface, which individual mirror, in the case of the reflection of the partial bundle of raw illumination light $30_i$ at this individual mirror 45, prefers an s-polarization compared to a p-polarization in a targeted manner. The s-polarization is the polarization direction of the partial bundle of raw illumination light $30_i$ which oscillates perpendicular to the plane of incidence (plane of the drawing of FIG. 5) of the individual mirror 45. The p-polarization is that polarization of the partial bundle of raw illumination light $30_i$ which oscillates in the plane of incidence of the individual mirror 45. In FIG. 5, the s-polarization is indicated by circles with crosses through them. Alternatively, the s-polarization is depicted by large points on the beam path of the partial bundle of illumination light $16_i$. The p-polarization is depicted by double-headed arrows on the beam path of the illumination light.

Preferring the s-polarization over the p-polarization in the case of reflection of the partial bundle of illumination light $30_i$ at the individual mirror 45 is such that a ratio Rp/Rs between a reflectivity Rp for the p-polarized raw illumination light 30 and a reflectivity Rs for the s-polarized raw illumination light 30 is less than 0.8. This preference for the s-polarization is illustrated in FIG. 5 by virtue of only the s-polarization component being reproduced after the reflection of the partial bundle of illumination light $30_i$ at the individual mirror 45.

Depending on the arrangement of the individual mirror 45, the angle of incidence I on this individual mirror 45 can be predetermined such that this results in a ratio Rp/Rs which is less than 0.7, which is less than 0.6, which is less than 0.5, which is less than 0.4, which is less than 0.3, which is less than 0.2, which is less than 0.1, which is less than 0.05, which is less than 0.02, which is less than 0.01, which is less than $1\times10^{-3}$, which is less than $1\times10^{-4}$, which is less than $1\times10^{-5}$ or which is even smaller.

The second facet mirror 9 is arranged downstream of the first facet mirror 8 in the beam path of the illumination light 3 (cf. FIG. 5). Respectively one facet 49 of the second facet mirror 9 completes the illumination channel with at least one of the individual mirrors 45 of the first facet mirror 8, for guiding the partial bundle of illumination light $3_i$ to the illumination field 14. In general, the arrangement is such that one of the facets 49 of the second facet mirror 9 completes a group illumination channel for several partial bundles $30_i$ together with a group of the individual mirrors 45 of the first facet mirror 8, with this facet 49 of the second facet mirror 8 and a group of individual mirrors 45 of the first facet mirror 8 belonging to the illumination channel. This group of individual mirrors 45 of the first facet mirror 8 therefore guides partial bundles of illumination light $3_i$ all over precisely the same facet 49 of the second facet mirror 9 to the illumination field 14.

By the reflection of the partial bundle of illumination light $3_i$ at the facet 49 of the second facet mirror 9, the s-polarization of the partial bundle of illumination light $3_i$ is once again preferred since, in this case, there is also a reflection with an angle of incidence I that is significantly different from 0. The two-fold reflection of the partial bundle of illumination light $3_i$, once at one of the individual mirrors 45 and a second time at one of the facets 49 of the second facet mirror 9, results in an almost complete or even wholly complete s-polarization when the partial bundle of illumination light $3_i$ is incident on the illumination field 14.

The facets 49 of the second facet mirror 9 are arranged on a facet support 50, which is indicated by a dashed line in FIG. 5. This facet support 50 has an annular design. The facet support 50 has a rotationally symmetric design in relation to the axis of incidence k of the illumination light 3.

The arrangement of the facets 49 of the second facet mirror 9 on the facet support 50 has a corresponding rotational symmetry.

Overall, the illumination optical unit 5 has a rotationally symmetric arrangement in relation to the axis of incidence k. The axis of incidence k passes through a center of the illumination field 14. The axis of incidence k is perpendicular to the object plane 15.

The rotational symmetry of the arrangement of the individual mirrors 45 of the first facet mirror 8 and of the facets 49 of the second facet mirror 9 enables a rotationally symmetric beam guidance, at least to a good approximation, of the partial bundles of raw illumination light $30_i$ and of the partial bundles of usable illumination light $3_i$ in relation to the axis of incidence k.

Facets 49 of the second facet mirror 9, which are provided for reflecting partial bundles of illumination light $3_i$ which are deflected by individual mirrors 45 of the first facet mirror 8 in the xz-plane, are depicted with dashed lines in FIG. 5, level with the axis of incidence k. As a result of the annular design of the facet support 50, these field facets 49 naturally, in accordance with the plane of the drawing in FIG. 5, lie at a distance from the axis of incidence k in both the positive and the negative x-direction. Corresponding facets 49 are arranged distributed uniformly on the facet support 50 in the circumferential direction around the axis of incidence k, such that the result of this is the, in principle, rotationally symmetric reflection arrangement for the partial bundles of illumination light $30_i$ and $3_i$. For every point on the illumination field 5, this results in illumination with tangentially polarized usable illumination light 3. In FIG. 5, this is depicted in more detail for an illumination field point 51.

From each illumination direction, the usable illumination light 3 is incident on the illumination field point 51 with s-polarization. Since the illumination field point 51 is illuminated with an annular illumination angular distribution 52 due to the annular arrangement of the field facets 49 (the illumination field point 51 "sees" an annular light source), this results in an s-polarization at every point of this annular illumination angular distribution 52, indicated by a circle in FIG. 7, which complements itself to a tangential polarization. A polarization vector 53 oscillates tangentially to the illumination angular distribution 52 at every point of the annular illumination angular distribution 52.

As a result of this tangential polarization, the reticle 17 can be illuminated with s-polarized usable illumination light 3 in the illumination field 14 independently of the illumination angle. This illumination enables an optimized structure resolution when using the illumination optical unit 5 as a component of the projection exposure apparatus 1.

The facet mirrors 8 and 9 simultaneously constitute the polarization setting device 44 of the illumination optical unit 5.

Using the illumination optical unit 5, the illumination field 14 can be illuminated with illumination angles that are greater than a lower limit for the illumination angle which is defined by a central shadowing of the beam path of the illumination light 30 or 3, which is predetermined by the individual mirror support 46.

Using the illumination optical unit 5, it is possible to realize an annular illumination setting or else a multi-pole illumination setting, e.g. a dipole illumination setting or a quadrupole illumination setting, e.g. a C-Quad-illumination setting.

Figure 6:
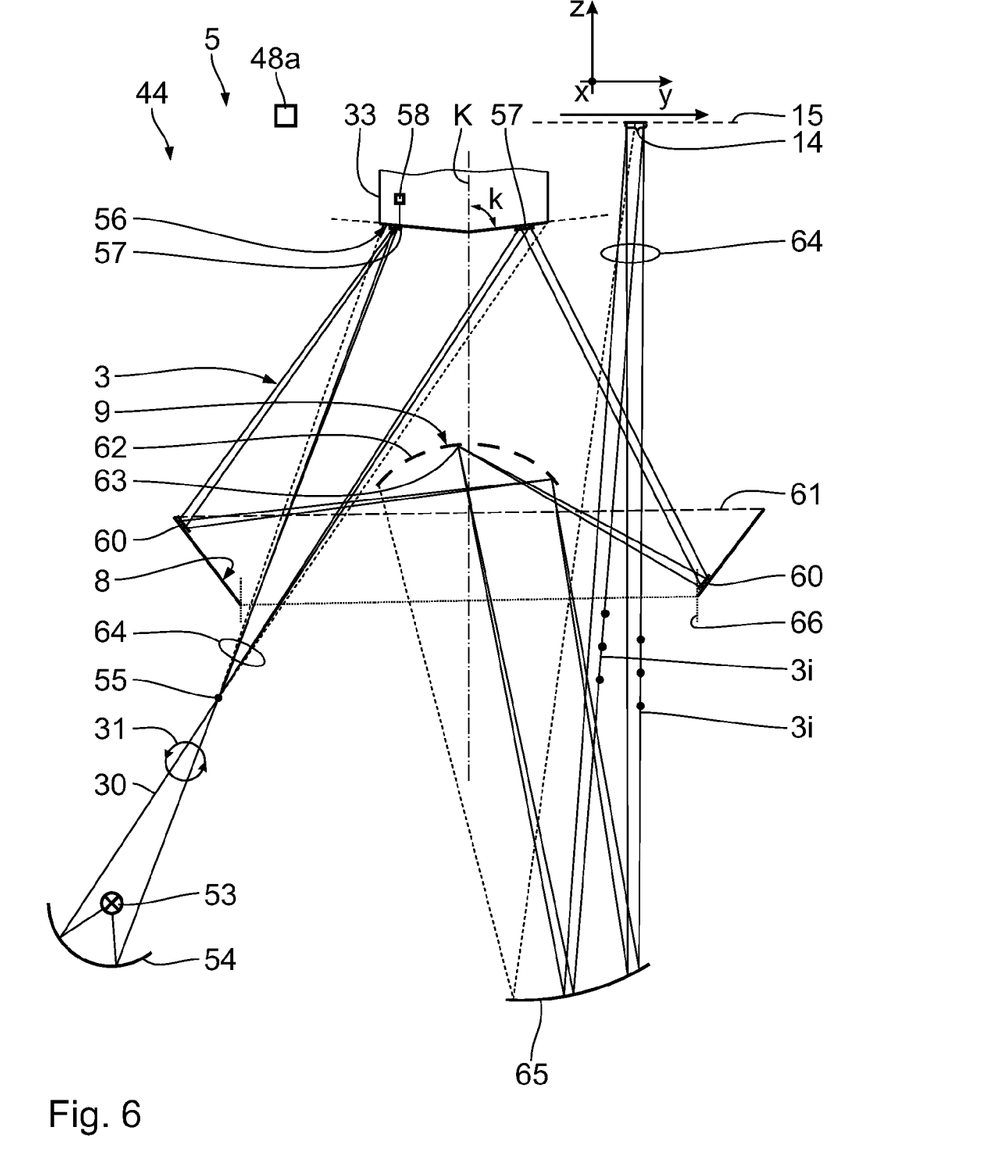
FIG. 6 shows a further embodiment of a polarization setting device.

Like FIG. 5, FIG. 6 shows a section from the illumination optical unit 5. The latter is embodied such that it guides the EUV raw output beam 30 from an EUV light source 53, which has an alternative embodiment to the electron beam-based EUV light source 2, to the object field 14. The EUV light source 53 can be a plasma source, e.g. a GDPP (gas discharge produced plasma) source or an LPP (laser produced plasma) source. Components and functions corresponding to those which were already explained above with reference to FIGS. 1 to 5 are denoted by the same reference signs and are not discussed again in detail.

The EUV raw radiation bundle 30, which emerges with circular polarization from the radiation source 53, is focused by a collector 54. An appropriate collector is known from e.g. EP 1 225 481 A.

After the collector 54, the EUV raw radiation bundle 30 propagates through an intermediate focus 55, before it is incident on an individual mirror array 56. The individual mirror array 56 is embodied as a micro-electromechanical system (MEMS). It has a multiplicity of individual mirrors 57 which are arranged in lines and columns in an array like a matrix, of which two individual mirrors 57 are depicted schematically in FIG. 6. The individual mirrors 57 can have square or rectangular reflection surfaces. The individual mirrors 57 are in each case connected to actuators 58 and are designed to be tiltable about two axes which are perpendicular to one another in the reflection plane of the respective individual mirror 57. The actuators 58 are signal connected in a manner not depicted to a central control device 48a, via which the actuators 58 can be actuated for individual tilting of the individual mirrors 57.

The number of individual mirrors 57 of the individual mirror array 56 is illustrated in a much understated fashion in the drawing. Overall, the individual mirror array 56 has approximately 100 000 individual mirrors 57. Depending on the size of the individual mirrors 57, the individual mirror array can also have e.g. 1000, 5000, 7000 or else several hundred thousand, e.g. 500 000, individual mirrors 57. Alternatively, there can also be a significantly smaller number of individual mirrors 57 and it may lie e.g. at several hundred individual mirrors, for example at 200, at 250, at 300 or at 500 individual mirrors. To the extent that very many individual mirrors 57 are present, these can be combined in groups, wherein the same individual mirror tilt angles are present in each case within one of the individual mirror groups. The individual mirrors 57 can have a highly reflective multiple layer, which is optimized for the respective angle of incidence and the wavelength of the EUV usable light 3.

A spectral filter can be arranged upstream of the individual mirror array 56, which spectral filter separates the utilized EUV raw radiation bundle 30 from other wavelength components of the emission of the radiation source 53 which cannot be used for the projection exposure. The spectral filter has not been illustrated.

Downstream of the individual mirror array 56, the EUV raw radiation bundle 30 is incident on a field facet mirror 8. The field facet mirror 8 is arranged in a plane of the illumination optical unit 5, which is optically conjugate to the object plane 15.

After the field facet mirror 8, the EUV radiation bundle 3 is reflected by a pupil facet mirror 9. The pupil facet mirror 9 lies either in an entry pupil plane of the illumination optical unit 5 or in a plane optically conjugate thereto. The field facet mirror 8 and the pupil facet mirror 9 are in each case made up from a multiplicity of facets, which are also referred to as honeycombs. Field facets 60 of the field facet mirror 8 are imaged in the object field 14 by a transmission optical unit, which is either formed by the pupil facet mirror 9 or which includes further components between the pupil facet mirror 9 and the object field 14. Here, each of the field facets 60 is imaged in the whole object field 14, provided that it is completely illuminated by the illumination light 3. The field facets 60 are arranged on an annular facet mirror support 61, which is schematically indicated in FIG. 1.

The EUV raw radiation bundle 30 is incident on the individual mirror array 56 at an angle of incidence which is less than 70°, i.e. not at grazing incidence. In principle, a grazing incidence is also possible. The field facets 60 of the field facet mirror 8 and pupil facets 62 of the pupil facet mirror 9 carry multi-layer reflection coatings which are matched to the wavelength of the usable light 3. The pupil facets 62 can have a round, hexagonal or rectangular design.

FIG. 6 depicts, in a schematic and exaggerated magnified manner, merely a few of the field facets 60 and a few of the pupil facets 62 of the facet mirrors 8, 9. The field facet mirror 8 has several thousand field facets 60, for example 3000 field facets 60. The pupil facet mirror 9 has several thousand pupil facets 62, for example 3000 pupil facets 62. The number of field facets 60 of the field facet mirror 8 can equal the number of pupil facets 62 of the pupil facet mirror 9.

The two facet mirrors 8, 9 are impinged upon with an angle of incidence, which deviates by at most 25° from a Brewster angle of the multi-layer reflection coating on the field facets 60 and the pupil facets 62. This Brewster angle of incidence can for example lie at 43°.

The pupil facet mirror 8 is arranged in a plane of the illumination optical unit 5, which constitutes a pupil plane of the projection optical unit 16 or is optically conjugate to a pupil plane of the projection optical unit 16. With the aid of the pupil facet mirror 8 or the transmission optical unit, the field facets 60 of the field facet mirror 8 are imaged superposed on one another in the object field 14.

The field facets 60 of the field facet mirror 8 have an x/y aspect ratio which corresponds to the x/y aspect ratio of the object field 14. The field facets 60 therefore have an x/y aspect ratio which is greater than 1. A long facet side of the field facets 60 extends in the x-direction. A short facet side of the field facets 60 extends in the y-direction (scanning direction).

The illumination optical unit 5 is arranged such that the intermediate focus 55 is imaged into a spatial region in which the pupil facets 62 are situated via illumination channels, which are in each case formed by at least one of the individual mirrors 57 and at least one of the field facets 60 and which guide a partial beam of the illumination light 3. An intermediate focus image 63 is thus created on each of the pupil facets 62. Depending on how many of the individual mirrors 57 contribute to the respective illumination channel, this intermediate focus image 63 can be created as superposition of several intermediate focus images which are created on the respective pupil facet 62 due to the guiding of the illumination light 3 via respectively one of the individual mirrors 57. Here, the intermediate focus image 63 need not be created exactly on the pupil facet 62 of the respective illumination channel. It suffices if the respective pupil facet 62 is situated in the region of the intermediate focus image 63 such that the intermediate focus image 63 more particularly comes to rest completely on the pupil facet 62.

Depending on whether the pupil facets 62 are parts of the transmission optical unit, which images the field facets 60 into the object field 14, the pupil facets 62 either have an imaging effect, i.e., in particular, have a concave design, or are designed as pure deflection mirrors or as plane mirrors.

The pupil facets 62 can support correction aspheres for correcting imaging defects of the illumination optical unit 5.

The number of individual mirrors 57 is at least as large as the number of field facets 60. In the embodiment according to FIG. 6, the number of individual mirrors 57 is in actual fact much greater than the number of field facets 60 and can, in particular, be ten times as great or even greater. The illumination optical unit 5 is embodied such that the individual mirror array 56 is not imaged on the field facets 60 and also not imaged on the pupil facets 62.

The field facets 60 and the pupil facets 62 are arranged such that the illumination channels which are in each case formed by exactly one of the field facets 60 and exactly one of the pupil facets 62, which are respectively aligned for guiding a partial beam $3_i$ of the illumination light $3_i$ are respectively fixedly assigned to a facet pair 60, 62, of which the field facet 60 and the pupil facet 62 are a part. Hence, an illumination beam path 64 is fixedly defined in the illumination optical unit 5 from the field facet mirror 8. A variation in the illumination is only brought about by tilting the individual mirrors 57 of the individual mirror array 56, wherein the individual mirror array 56 is used to select which ones of the field facets 60 are impinged upon, optionally in sections, by the raw illumination light 30.

In the illumination optical unit 5 according to FIG. 6, the pupil facets 62 of the pupil facet mirror 9 have a planar design. A relay optical unit in the form of a concave mirror 65 serves as transmission optical unit for imaging the field facets 60 of the field facet mirror 8 in the object field 14.

In the illumination optical unit 5, the reflection surfaces of the pupil facets 62 can optionally be designed as correction aspheres in order to correct imaging defects of the imaging by the concave mirror 65.

In the illumination beam path 64 of the illumination optical unit 5 according to FIG. 6, the illumination light 3 is guided between the concave mirror 65 and the object field 14 through a passage opening 66 of the field facet mirror support 61, through which the illumination light 3 is also guided in the illumination beam path 64 between the pupil facet mirror 9 and the concave mirror 65.

Moreover, in the illumination optical unit according to FIG. 6, the raw illumination light 30 is guided through the passage opening 66 between the intermediate focus 55 and the individual mirror array 56.

The field facet mirror 8 and the pupil facet mirror 9 according to FIG. 6 once again realize a polarization setting device 44 of the illumination optical unit 5. Using this polarization setting device 44 according to FIG. 6, it is likewise possible to realize a tangential polarization distribution when illuminating the object field 14, as already explained above. By way of example, in accordance with the drawing plane of FIG. 6, the partial beams of illumination light $3_i$ are accordingly s-polarized when radiating in front of the object field 14.

All EUV mirror surfaces can carry a highly reflective coating for the employed EUV wavelengths in the range between 5 nm and 30 nm. The coatings can be multilayer coatings. The multilayer coatings can be designed as alternating multilayers of two different coating materials, for example as a sequence of molybdenum/silicon bi-layers.

In the production of a microstructured or nanostructured component using the projection exposure apparatus 1, the reticle 17 and the wafer 22 are initially provided. A structure on the reticle 17 is subsequently projected onto a light-sensitive layer of the wafer 22 with the aid of the projection exposure apparatus 1. By developing the light-sensitive layer, a microstructure or nanostructure is produced on the wafer 22 and hence the microstructured or nanostructured component is produced, for example a semiconductor component in the form of a memory chip.

The invention claimed is:

1. An EUV light source, comprising:
   an EUV generation device configured to generate a first beam of EUV light that is circularly polarized; and
   a polarization setting device configured to have a linearly polarizing effect on the first beam of EUV light to provide a second beam of EUV light, wherein the polarization setting device comprises an EUV deflection mirror configured to operate in a region of a Brewster angle of incidence of the first beam on the deflection mirror.

2. The EUV light source of claim 1, further comprising an electron beam supply device configured to provide an electron beam to the EUV generation device.

3. The EUV light source of claim 1, wherein:
   the EUV deflection mirror is rotatable about an axis that coincides with an axis of incidence of the first beam on the EUV deflection mirror so as to rotate a plane of incidence of the first beam on the EUV deflection mirror.

4. The EUV light source of claim 3, wherein the polarization setting device comprises exactly three EUV deflection mirrors, and each of the three EUV deflection mirrors is in a region of a Brewster angle of incidence for the first beam.

5. The EUV light source of claim 3, wherein:
   the polarization setting device comprises a first EUV deflection mirror and a second EUV deflection mirror downstream of the first EUV deflection mirror; and
   the polarization setting device is configured so that, after deflecting from the second EUV deflection mirror, the second beam propagates in the same direction as the first beam.

6. The EUV light source of claim 5, wherein the polarization setting device does not include any EUV deflection mirrors in addition to the first and second EUV deflection mirrors.

7. The EUV light source of claim 1, wherein:
   the polarization setting device comprises a first EUV deflection mirror and a second EUV deflection mirror downstream of the first EUV deflection mirror; and
   the polarization setting device is configured so that, after deflecting from the second EUV deflection mirror, the second beam propagates in the same direction as the first beam.

8. The EUV light source of claim 7, wherein the polarization setting device does not include any EUV deflection mirrors in addition to the first and second EUV deflection mirrors.

9. The EUV light source of claim 1, wherein:
   the polarization setting device comprises first, second and third EUV deflection mirrors;
   the third EUV deflection mirror is downstream of both the first and second EUV deflection mirrors; and
   the polarization setting device is configured so that, after deflecting from the third EUV mirror, the second beam propagates along an axis of incidence of the first beam.

10. The EUV light source of claim 9, wherein the polarization setting device does not include any EUV deflection mirrors in addition to the first, second and third EUV deflection mirrors.

11. The EUV light source of claim 1, wherein the polarization setting device comprises an EUV deflection prism comprising two sides surfaces configured as mirror surfaces.

12. The EUV light source of claim 1, wherein:
immediately upstream of the polarization setting device, the first beam propagates in a first direction; and
immediately downstream of the EUV polarization setting device, the second beam propagates in a second direction which is parallel to the first direction.

13. The EUV light source of claim 1, wherein:
the EUV light source is configured so that the EUV light source is switchable between first and second modes;
in the first mode, the EUV light source provides the first beam; and
in the second mode, the EUV light source provides the second beam.

14. The EUV light source of claim 1, wherein:
immediately upstream of the polarization setting device, the first beam propagates along an axis; and
immediately downstream of the EUV polarization setting device, the second beam propagates along the axis.

15. A system, comprising:
an EUV light source according to claim 1; and
an illumination optical unit,
wherein the EUV light source is configured to provide the second beam to the illumination optical unit, and the illumination optical unit is configured to illuminate an illumination field.

16. An apparatus, comprising:
an EUV light source according to claim 1; and
an illumination optical unit; and
a projection optical unit,
wherein the EUV light source is configured to provide the second beam to the illumination optical unit, the illumination optical unit is configured to illuminate an illumination field, and the projection optical unit is configured to image the illumination field into an image field.

17. A method of using an apparatus which comprises an EUV light source, an illumination optical unit and a projection optical unit, the method comprising:
using the light source to convert a first beam of EUV light to a second beam of EUV light, the light source being a light source according to claim 1;
using the illumination optical unit to illuminate at least a portion of a reticle in an illumination field; and
using the projection optical unit to image at least a portion of the illuminated reticle onto a light-sensitive material.

18. A system, comprising:
an EUV generation device configured to generate a first beam of EUV light that is circularly polarized; and
an illumination optical unit, comprising:
a polarization setting device configured to have a linearly polarizing effect on the first beam of EUV light to provide a second beam of EUV light,
wherein the EUV generation device is configured to provide the first beam to the illumination optical unit, the illumination optical unit is configured to illuminate an illumination field, the polarization setting device comprises an EUV deflection mirror configured to operate in a region of a Brewster angle of incidence of the first beam on the deflection mirror.

19. An apparatus, comprising:
the system of claim 18; and
a projection optical unit,
wherein the projection optical unit is configured to image the illumination field into an image field.

20. A method of using an apparatus which comprises an EUV light source, an illumination optical unit and a projection optical unit, the method comprising:
using the system according to claim 18 to illuminate a reticle with the second beam of EUV light; and
using the projection optical unit to image at least a portion of the reticle onto a light-sensitive material.

* * * * *

UNITED STATES PATENT AND TRADEMARK OFFICE
CERTIFICATE OF CORRECTION

PATENT NO. : 9,955,563 B2
APPLICATION NO. : 14/636413
DATED : April 24, 2018
INVENTOR(S) : Ingo Saenger et al.

Page 1 of 1

It is certified that error appears in the above-identified patent and that said Letters Patent is hereby corrected as shown below:

In the Specification

Column 10, Line 17, delete "$3_i$," and insert -- 3, --;

Column 13, Line 15, delete "$3_i$," and insert -- 3, --.

Signed and Sealed this
Eleventh Day of December, 2018

Andrei Iancu
*Director of the United States Patent and Trademark Office*